United States Patent
Butzmann et al.

(10) Patent No.: US 10,063,082 B2
(45) Date of Patent: Aug. 28, 2018

(54) BATTERY WITH CELL BALANCING

(75) Inventors: Stefan Butzmann, Beilstein (DE); Holger Fink, Stuttgart (DE)

(73) Assignees: Samsung SDI Co., Ltd., Yongin-si, Gyeonggi-do (KR); Robert Bosch GmbH, Stuttgart (DE)

( * ) Notice: Subject to any disclaimer, the term of this patent is extended or adjusted under 35 U.S.C. 154(b) by 292 days.

(21) Appl. No.: 13/641,666

(22) PCT Filed: Feb. 16, 2011

(86) PCT No.: PCT/EP2011/052273
§ 371 (c)(1),
(2), (4) Date: Feb. 25, 2013

(87) PCT Pub. No.: WO2011/128135
PCT Pub. Date: Oct. 20, 2011

(65) Prior Publication Data
US 2013/0175995 A1    Jul. 11, 2013

(30) Foreign Application Priority Data
Apr. 16, 2010   (DE) .................. 10 2010 027 869

(51) Int. Cl.
*H02J 7/00* (2006.01)
*H01M 10/48* (2006.01)
(Continued)

(52) U.S. Cl.
CPC ........... *H02J 7/007* (2013.01); *B60L 11/1853* (2013.01); *B60L 11/1864* (2013.01);
(Continued)

(58) Field of Classification Search
USPC ........................................................ 320/119
See application file for complete search history.

(56) References Cited

U.S. PATENT DOCUMENTS

| 4,238,721 A | 12/1980 | DeLuca et al. |
| 6,624,612 B1 | 9/2003 | Lundquist |

(Continued)

FOREIGN PATENT DOCUMENTS

| DE | 10 2009 000 731 A1 | 8/2010 |
| GB | 2 420 235 A | 5/2006 |

(Continued)

OTHER PUBLICATIONS

International Search Report corresponding to PCT Application No. PCT/EP2011/052273, dated Aug. 30, 2011 and English (German and English language document) (5 pages).

*Primary Examiner* — Eric Lee
(74) *Attorney, Agent, or Firm* — Maginot, Moore & Beck LLP

(57) ABSTRACT

A battery includes at least one battery module line, a sensor means for determining a charging stage of a battery cell, and a control unit. The battery module line includes a plurality of battery modules mounted in series, each module having at least one battery cell and a coupling unit. The at least one battery cell is mounted between a first input and a second input of the coupling unit, and the coupling unit is configured (i) to switch the at least one battery cell between a first terminal of the battery module and a second terminal of the battery module, on a first control signal, and (ii) to connect the first terminal to the second terminal on a second control signal. The sensor means is connectable to the at least one battery cell of each battery module.

7 Claims, 5 Drawing Sheets

(51) Int. Cl.
    *B60L 11/18*      (2006.01)
    *G01R 31/36*     (2006.01)
    *H01M 10/0525*  (2010.01)

(52) U.S. Cl.
    CPC ....... *B60L 11/1866* (2013.01); *H01M 10/482* (2013.01); *H01M 10/486* (2013.01); *H02J 7/0016* (2013.01); *G01R 31/3658* (2013.01); *H01M 10/0525* (2013.01); *Y02E 60/122* (2013.01); *Y02P 70/54* (2015.11); *Y02T 10/7011* (2013.01); *Y02T 10/7055* (2013.01); *Y02T 10/7061* (2013.01)

(56) References Cited

U.S. PATENT DOCUMENTS

| | | | |
|---|---|---|---|
| 8,288,992 B2* | 10/2012 | Kramer et al. | 320/119 |
| 2010/0073005 A1 | 3/2010 | Yano et al. | |
| 2010/0121511 A1* | 5/2010 | Onnerud et al. | 701/22 |
| 2011/0025258 A1* | 2/2011 | Kim | H02J 7/0013 |
| | | | 320/106 |

FOREIGN PATENT DOCUMENTS

| | | |
|---|---|---|
| JP | 6-290815 A | 10/1994 |
| JP | 2001-145273 A | 5/2001 |
| JP | 2008-125158 A | 5/2008 |

\* cited by examiner

BATTERY WITH CELL BALANCING

This application is a 35 U.S.C. § 371 National Stage Application of PCT/EP2011/052273, filed on Feb. 16, 2011, which claims the benefit of priority to Serial No. DE 10 2010 027 869.6, filed on Apr. 16, 2010 in Germany, the disclosures of which are incorporated herein by reference in their entirety.

The present disclosure relates to a battery with novel cell balancing.

BACKGROUND

It is apparent that in future battery systems will be used increasingly both in stationary applications and in vehicles such as hybrid vehicles and electric vehicles. In order to be able to meet the requirements which are made for the respective application in terms of voltage and available power, a large number of battery cells are connected in series. Since the current which is made available by such a battery must flow through all the battery cells, and a battery cell can only conduct a limited current, battery cell are often additionally connected in parallel in order to increase the maximum current.

FIG. 1 shows a customary battery 10 in a detailed block diagram. A plurality of battery cells 11 are connected in series and optionally additionally in parallel in order to obtain a high output voltage (series circuit) and battery capacity (parallel circuit) which is desired for a respective application. A charging and disconnecting device 14 is connected between the positive pole of the battery cells and a positive battery terminal 12. It is optionally also possible to connect a disconnecting device 15 between the negative pole of the battery cells and a negative battery terminal 13. The disconnecting and charging device 14 and the disconnecting device 15 each comprise a contactor 16 or 17, which is provided for disconnecting the battery cells 11 from the battery terminals 12, 13, in order to connect the battery terminals 12, 13 in a voltage-free fashion. Owing to the high direct voltage of the series-connected battery cells 11 there is otherwise a considerable potential hazard for maintenance personnel or the like. In addition, a charging contactor 18 with a charging resistor 19 which is connected in series with the charging contactor 18 is provided in the charging and disconnecting device 14. The charging resistor 19 limits a charging current for the buffer capacitor connected into the direct voltage intermediate circuit of a customary battery-fed drive system, if the battery is connected to the direct voltage intermediate circuit. For this purpose, the contactor 16 is firstly left open, and only the charging contactor 18 is closed, with the result that a current which is limited by the charging resistor 19 and which can reach a maximum current equal to the battery voltage divided by the resistance of the charging resistor 19. If the voltage at the positive battery terminal 12 at least approximately reaches the battery voltage, the contactor 16 can be closed and, if appropriate, the charging contactor 18 can be opened. The contactors 16, 17 and the charging contactor 18 considerably increase the costs for a battery 10 since stringent requirements are made of their reliability and the currents which they are to conduct.

The series connection of a high number of battery cells means that, in addition to the high overall voltage, there is the problem that the entire battery fails if a single battery cell fails because the battery current has to be able to flow in all the battery cells owing to the series connection. Such a failure of the battery can lead to a failure of the entire system. In the case of an electric vehicle, a failure of the drive battery causes the vehicle to become immobile, and in other devices, such as for example the rotor blade adjustment in the case of wind turbine plants this can even lead to dangerous situations in the case of strong wind. For this reason, a high level of reliability of the battery is advantageous. According to the definition, the term "reliability" means the ability of a system to operate correctly for a predefined time.

A widespread approach for increasing the service life of a battery is what is referred to as cell balancing. It is based on the idea of loading all the battery cells of a battery as uniformly as possible so that an individual battery cell is not discharged prematurely causing the entire battery to fail even though sufficient electrical energy is still available in the other battery cells. A prematurely discharged battery cell also constitutes a considerable risk for safe operation because the discharged battery cell starts, from the point of view of the remaining battery cells, to constitute a load which can heat up greatly owing to the current which continues to flow. If a battery continues to be operated even though a battery cell is already discharged, there is the risk of destruction of the battery cell and therefore of continuous failure of the entire battery. The prior art therefore contains various approaches to cell balancing which locate a battery cell with a relatively high cell voltage and selectively discharge it with respect to the other battery cells (resistive cell balancing). Since in the case of resistive cell balancing the energy which is extracted by the cell balancing is lost, inductive cell balancing was also proposed in which the electrical energy which is extracted from the battery cell to be discharged is fed to another battery cell. However, in this context there are also electrical power losses and in addition there has to be a high degree of expenditure on circuitry by using coils which are costly and voluminous.

SUMMARY

According to the disclosure, a battery having at least one battery module line, sensor means for determining a state of charge of a battery cell and a control unit is therefore introduced. The battery module line comprises a multiplicity of battery modules which are connected in series, each of which has at least one battery cell and a coupling unit. The at least one battery cell is connected between a first input and a second input of the coupling unit, and the coupling unit is designed to connect the at least one battery cell between a first terminal of the battery module and a second terminal of the battery module in response to a first control signal, and to connect the first terminal to the second terminal in response to a second control signal. The sensor means can be connected to the at least one battery cell of each of the battery modules. The control unit is connected to the sensor means and is designed to select a battery module whose at least one battery cell has a lowest state of charge of all the battery modules, and to output the second control signal to the coupling unit of the selected battery module of the battery module line. If more than one battery module line is provided, the selection of a battery module for each battery module line can be performed individually.

The coupling unit makes it possible either to couple one or more battery cells of a battery module, which battery cells are connected between the first and the second input of the coupling unit, to the output of the coupling unit in such a way that the voltage of the battery cells is available externally, or else to bypass the battery cells with the result that a voltage of 0 V can be seen externally. In the first case, the battery cells take part in the provision of electrical energy by the battery, but they do not do so in the second case.

The battery therefore has the advantage that cell balancing becomes possible solely through the chronological distribution of the actual load of the battery among the battery cells during operation. A battery module having one or more battery cells with a higher state of charge than battery cells of other battery modules is involved longer in the provision of electrical energy than those with a relatively low state of charge until equalization has taken place. The energy which is extracted from the battery cells which have the relatively high charge is in this way used directly for the actual purpose of use of the battery, and is not wasted as in the case of resistive cell balancing or transferred to another battery cell with a high degree of expenditure and also still subject to loss as in the case of inductive cell balancing.

The cell balancing of the disclosure can in an extreme case be operated for individual battery cells if specifically a coupling unit also has just one battery cell. However, groups of battery cells which are connected to a coupling unit can, as a compromise which is appropriate in terms of circuitry, also be subjected jointly to the cell balancing.

Although the output voltage of the battery drops as a result of disconnection of a battery module, a relatively low output voltage does not lead to a failure of the entire arrangement in customary applications and is therefore acceptable.

The coupling unit can have a first output and can be designed to connect either the first input or the second input to the output in response to the first control signal. The output is connected here to one of the terminals of the battery module, and either the first or second input is connected to the other of the terminals of the battery module. Such a coupling unit can be implemented by using just two switches, preferably semiconductor switches such as MOSFETs or IGBTs.

Alternatively, the coupling unit can have a first output and a second output and can be designed to connect the first input to the first output, and the second input to the second output in response to the first control signal. In this context, the coupling unit is also designed to disconnect the first input from the first output, and the second input from the second output, in response to the second control signal, and to connect the first output to the second output. This embodiment requires a somewhat higher degree of expenditure on circuitry (usually three switches), but disconnects the battery cells of the battery module at its two poles, with the result that when there is a risk of total discharging or of damage to a battery module, the battery cells thereof are connected in a voltage-free fashion and can therefore be replaced without risk during ongoing operation of the entire arrangement.

The sensor means can comprise a voltage measuring unit which is designed to determine a cell voltage of a battery cell or a voltage of a battery module. The cell voltage of a battery cell or the voltage of a battery module is the most important parameter during the determination of the state of charge of a battery cell or of a battery module. Particularly precise conclusions are possible if the time profile of the cell voltage or the battery module voltage is also detected and evaluated.

In addition, the sensor means can comprise a temperature measuring unit which is designed to determine a cell temperature of the battery cell or a temperature of the battery module. Both the cell voltage and the capacity of a battery cell are temperature-dependent, for which reason additional detection of the temperature of a battery cell or of the battery module permits more precise determination of the state of charge.

The sensor means can also comprise a current measuring unit which is designed to determine a current of the at least one battery module line. Given relatively high loading, the cell voltage of a battery cell or the voltage of a battery module will be lower with the same state of charge than with a lower load. For this reason, the determination of the state of charge can be performed more precisely and under changing loads if the current of the battery module line is additionally determined.

The battery particularly preferably has precisely three battery module lines. This permits operation of three-phase drive motors from a battery.

The at least one battery cell is preferably a lithium-ion battery cell. Lithium-ion battery cells have the advantages of a high cell voltage and a large capacity in a given volume.

A second aspect of the disclosure relates to a motor vehicle having an electric drive motor for driving the motor vehicle and a battery connected to the electric drive motor, according to the inventive aspect above.

BRIEF DESCRIPTION OF THE DRAWINGS

The exemplary embodiments of the disclosure are explained in more detail with reference to the drawings and the following description, wherein identical reference symbols denote identical or functionally identical components; in said drawings.

DETAILED DESCRIPTION

Figure 2:
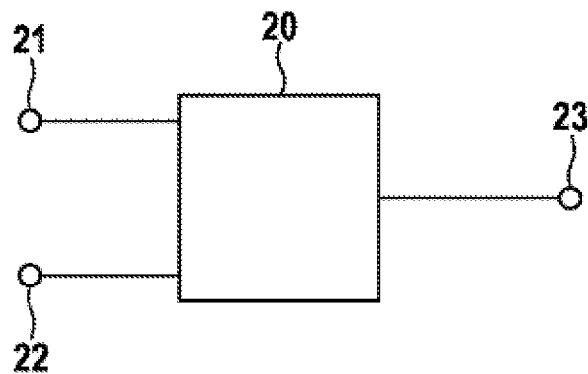
FIG. 2 shows a first embodiment of a coupling unit for use in the battery according to the disclosure.

FIG. 2 shows a first embodiment of a coupling unit 20 for use in the battery according to the disclosure. The coupling unit 20 has two inputs 21 and 22 and an output 23 and is designed to connect one of the inputs 21 or 22 to the output 23, and to disconnect the other. In specific embodiments of the coupling unit, the latter can also be designed to disconnect both inputs 21, 22 from the output 23. However, there is no provision for both the input 21 and the input 22 to be connected to the output 23, which would lead to short-circuiting of the two inputs 21, 22.

Figure 3:
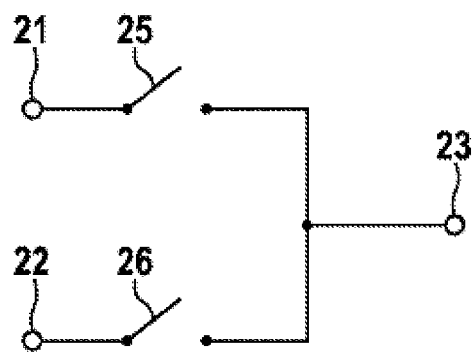
FIG. 3 shows a possible implementation of the first embodiment of the coupling unit in terms of circuitry.

FIG. 3 shows a possible implementation of the first embodiment of the coupling unit 20 in terms of circuitry, in which embodiment a first and a second switch 25 and 26, respectively, are provided. Each of the switches is connected between one of the inputs 21 or 22 and the output 23. This embodiment provides the advantage that both inputs 21, 22 can also be disconnected from the output 23, with the result that the output 23 is made a high impedance output, which can be useful, for example, in the case of repair or maintenance. In addition, the switches 25, 26 can be implemented simply as semiconductor switches such as, for example, a MOSFETs or IGBTs. Semiconductor switches have the advantage of a favorable price and a high switching speed, with the result that the coupling unit 20 can react to a control signal or a change in the control signal within a short time and high switching rates can be achieved.

Figure 4A:
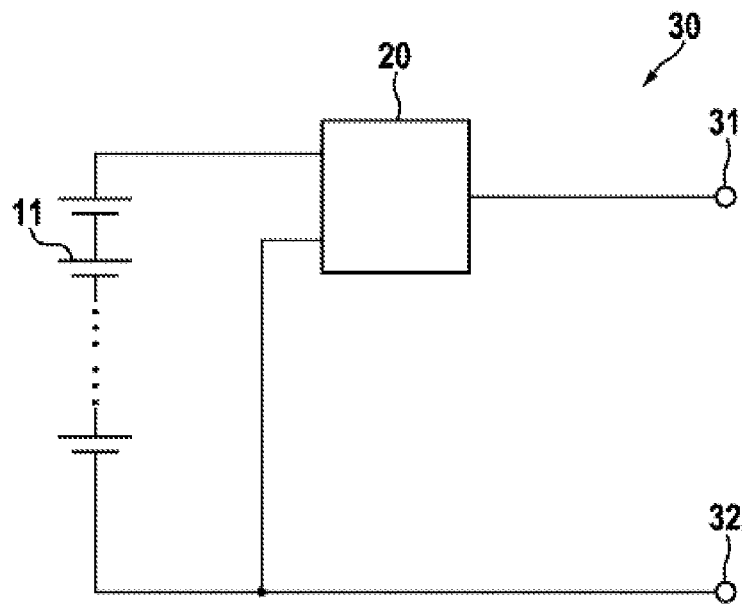
FIGS. 4A and 4B show two embodiments of a battery module with the first embodiment of the coupling unit.
Figure 4B:
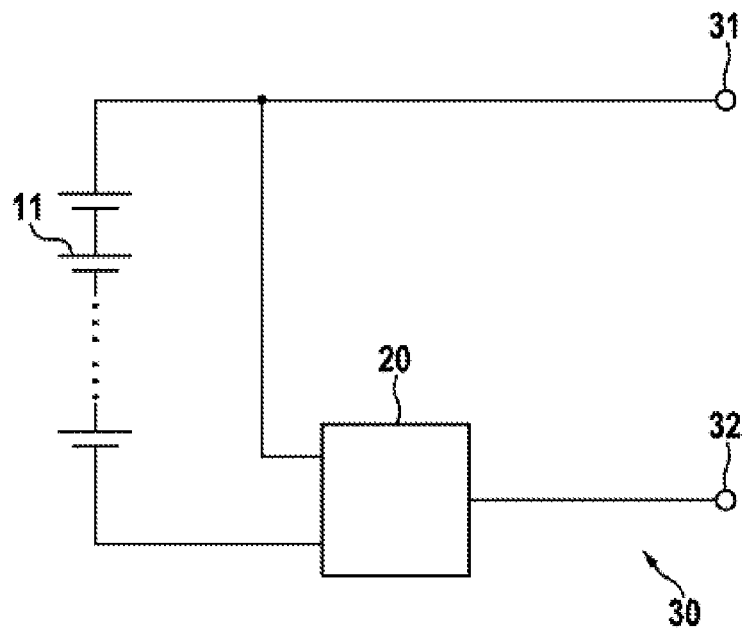

FIGS. 4A and 4B show two embodiments of a battery module 30 with the first embodiment of the coupling unit 20. A multiplicity of battery cells 11 are connected in series between the inputs of the coupling unit 20. However, the disclosure is not restricted to such a series connection of battery cells 11; it is also possible to provide just a single battery cell 11 or else a parallel circuit or mixed serial-parallel circuit of battery cells 11. In the example in FIG. 4A, the output of the coupling unit 20 is connected to a first terminal 31, and the negative pole of the battery cells 11 is connected to a second terminal 32. However, an approximate mirror-image arrangement as in FIG. 4B is possible in which the positive pole of the battery cell 11 is connected to the first terminal 31, and the output of the coupling unit 20 is connected to the second terminal 32.

Figure 5:
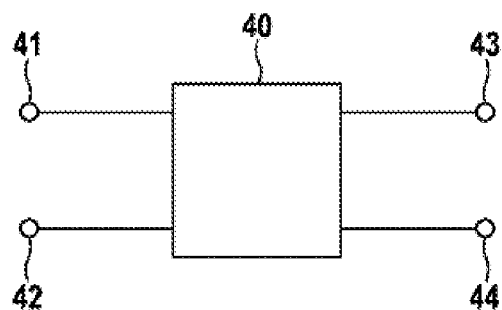
FIG. 5 shows a second embodiment of a coupling unit for use in the battery according to the disclosure.

FIG. 5 shows a second embodiment of a coupling unit 40 for use in the battery according to the disclosure. The coupling unit 40 has two inputs 41 and 42 and two outputs 43 and 44. Said coupling unit 40 is designed either to connect the first input 41 to the first output 43, and the second input 42 to the second output 44 (and to disconnect the first output 43 from the second output 44), or else to connect the first output 43 to the second output 44 (and in the process disconnect the inputs 41 and 42). In specific embodiments of the coupling unit, they can also be designed to disconnect both inputs 41, 42 from the outputs 43, 44, and also to disconnect the first output 43 from the second output 44. There is however no provision to connect both the first input 41 to the second input 42.

Figure 6:
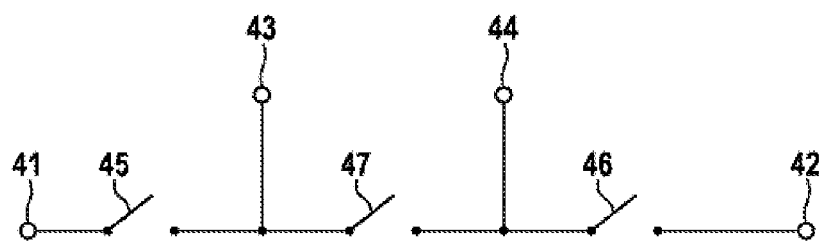
FIG. 6 shows a possible implementation of the second embodiment of the coupling unit in terms of circuitry.

FIG. 6 shows a possible implementation of the second embodiment of the coupling unit 40 in terms of circuitry, in which embodiment a first, a second and a third switch 45, 46, and 47 are provided. The first switch 45 is connected between the first input 41 and the first output 43, the second switch 46 is connected between the second input 42 and the second output 44, and the third switch 47 is connected between the first output 43 and the second output 44. This embodiment also provides the advantage that the switches 45, 46 and 47 can be simply implemented as semiconductor switches such as, for example, MOSFETs or IGBTs. Semiconductor switches have the advantage of a favorable price and a high switching speed, so that the coupling unit 40 can react to a control signal or a change in the control signal in a short time and high switching rates are achievable.

Figure 7:
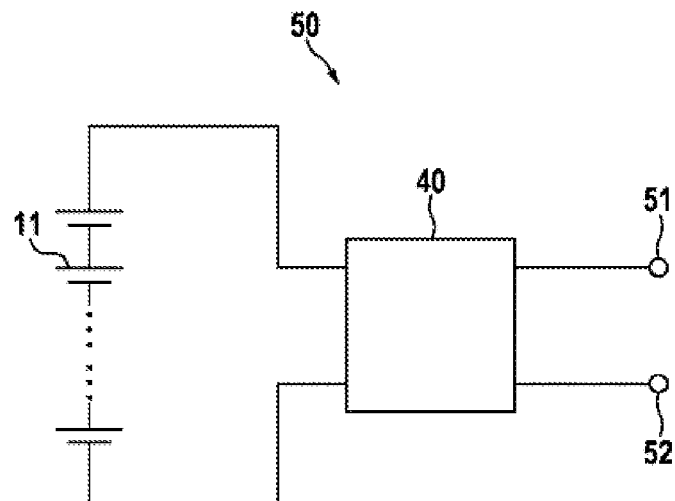
FIG. 7 shows an embodiment of a battery module with the second embodiment of the coupling unit.

FIG. 7 shows an embodiment of a battery module 50 with the second embodiment of the coupling unit 40. A multiplicity of battery cells 11 are connected in series between the inputs of a coupling unit 40. This embodiment of the battery module 50 is likewise not restricted to such a series connection of battery cells 11; it is in turn also possible to provide just a single battery cell 11 or else a parallel circuit or mixed serial-parallel circuit of battery cells 11. The first output of the coupling unit 40 is connected to a first terminal 51, and the second output of the coupling unit 40 is connected to a second terminal 52. The battery module 50 provides, compared to the battery module 30 in FIGS. 4A and 4B, the advantage that the battery cells 11 can be decoupled from the rest of the battery on both sides by the coupling unit 40, which permits risk-free exchange during ongoing operation since the hazardous high composite voltage of the rest of the battery modules of the battery is not present at any pole of the battery cells 11.

Figure 1:
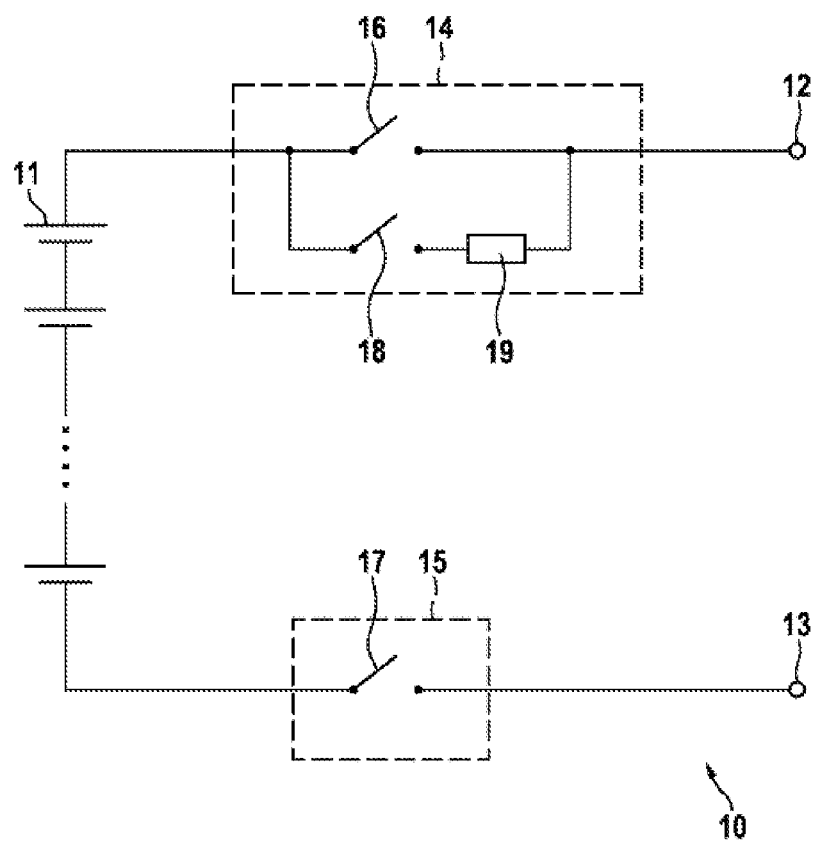
FIG. 1 shows a block circuit diagram of a battery according to the prior art.
Figure 8:
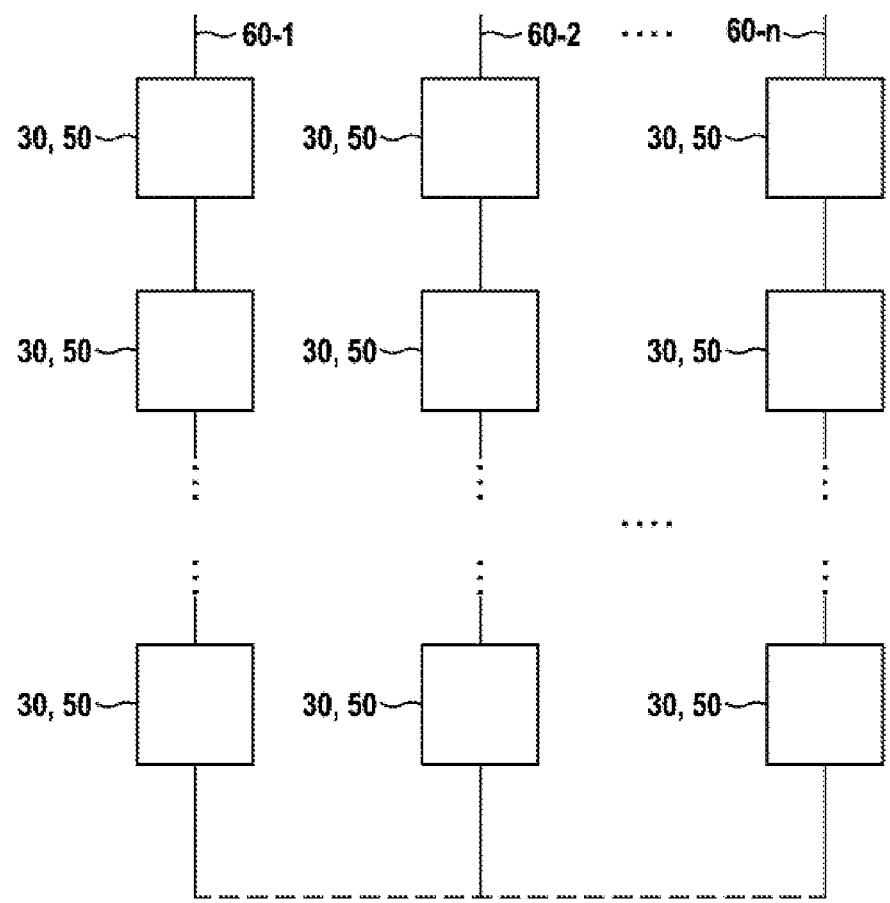
FIG. 8 shows an embodiment of the battery according to the disclosure.

FIG. 8 shows an embodiment of the battery according to the disclosure which has n battery module lines 60-1 to 60-n. Each battery module line 60-1 to 60-n has a multiplicity of battery modules 30 or 50, wherein preferably each battery module line 60-1 to 60-n contains the same number of battery modules 30 or 50 connected in an identical way, and each battery module 30, 50 contains the same number of battery cells 11 connected in an identical way. One pole of each battery module line 60 can be connected to a corresponding pole of the other battery module lines 60, which is indicated by a dashed line in FIG. 8. In general, a battery module line 60 can contain any number of battery modules 30, 50 greater than 1, and a battery can contain any number of battery module lines 60. It is also possible for charging and disconnecting devices and disconnecting devices as described in FIG. 1 to be provided additionally at the poles of the battery module lines 60 if safety regulations require this. However, such disconnecting devices are not necessary according to the disclosure because disconnection of the battery cells 11 from the battery connections can occur by means of the coupling units 20, 40 which are contained in the battery modules 30, 50.

As already described, the battery according to the disclosure permits cell balancing, in which the battery cells of a battery module with a comparatively high state of charge are used for making available electrical energy over a longer time period than the battery cells of a battery module with a comparatively low state of charge. As a result, all the electrical energy which is stored in the battery is actually made available for the battery-operated application, instead of being either wasted within the scope of a normal cell balancing process or being redistributed in a costly way which involves loss.

A further advantage of the battery according to the disclosure is that it can very easily be constructed in a modular fashion from individual battery modules with an integrated coupling unit. As a result, the use of identical parts (kit principle) becomes possible.

The invention claimed is:
1. A battery comprising:
at least one battery module line;
a sensor means configured to determine a state of charge of a battery cell; and
a control unit configured to output a first control signal and a second control signal,
wherein the at least one battery module line includes a multiplicity of battery modules which are connected in series, each battery module including a first terminal for connecting a first pole of the battery module to the battery module line, a second terminal for connecting a second pole of the battery module to the battery module line, at least one battery cell and a coupling unit for connecting the at least one battery cell between the first terminal and the second terminal,
wherein the sensor means is connectable to the at least one battery cell of each of the battery modules,
wherein the coupling unit has first input, a second input, a first output and a second output, the first input being connected to a first pole of the at least one battery cell associated with the coupling unit, the second input being connected to a second pole of the at least one battery cell associated with the coupling unit of the battery module associated with the coupling unit, the first output being connected the first terminal, the second output being connected to the second terminal of the battery module associated with the coupling unit, wherein the coupling unit is configured to connect the first input to the first output, connect the second input to the second output and disconnect the first output from the second output in response to receiving the first control signal such that the first pole and the second pole of the at least one battery cell associated with the coupling unit are connected to the first terminal and the second terminal, respectively, for the battery module associated with the coupling unit on the battery module line and the battery module associated with the coupling unit is connected in series to the battery module line, and wherein the coupling unit is configured to disconnect the first input from the first output, disconnect the second input from the second output, and connect the first output to the second output of the battery module associated with the coupling unit in response to receiving the second control signal such that the first pole and the second pole of the at least one battery cell of the battery module associated with the coupling unit are disconnected from the first terminal and the second terminal, respectively, for the battery module and the first terminal and the second terminal are connected to each other, and wherein the control unit is connected to the sensor means and is configured (i) to select a battery module whose at least one battery cell has a lowest monitored state of charge of all the battery modules of the battery module line, and (ii) to output the second control signal to the coupling unit of the selected battery module.

2. The battery as claimed in claim 1, wherein the sensor means includes a voltage measuring unit which is configured to determine a cell voltage of a battery cell or a voltage of a battery module.

3. The battery as claimed in claim 2, wherein the sensor means also includes a temperature measuring unit which is configured to determine a cell temperature of the battery cell or a temperature of the battery module.

4. The battery as claimed in claim 2, wherein the sensor means also includes a current measuring unit which is configured to determine a current of the at least one battery module line.

5. The battery as claimed in claim 1, wherein the battery includes three of the battery module lines.

6. The battery as claimed in claim 1, wherein the at least one battery cell is a lithium-ion battery cell.

7. A motor vehicle comprising:
an electric drive motor configured to drive the motor vehicle; and
a battery connected to the electric drive motor, the battery including (i) at least one battery module line, (ii) a sensor means configured to determine a state of charge of a battery cell, and (iii) a control unit configured to output a first control signal and a second control signal, wherein the at least one battery module line includes a multiplicity of battery modules which are connected in series, each battery module including a first terminal for connecting a first pole of the battery module to the battery module line, a second terminal for connecting a second pole of the battery module to the battery module line, at least one battery cell and a coupling unit for connecting the at least one battery cell between the first terminal and the second terminal, wherein the sensor means is connectable to the at least one battery cell of each of the battery modules, wherein the coupling unit has first input, a second input, a first output and a second output, the first input being connected to a first pole of the at least one battery cell associated with the coupling unit, the second input being connected to a second pole of the at least one battery cell associated with the coupling unit of the battery module associated with the coupling unit, the first output being connected the first terminal, the second output being connected to the second terminal of the battery module associated with the coupling unit, wherein the coupling unit is configured to connect the first input to the first output, connect the second input to the second output and disconnect the first output from the second output in response to receiving the first control signal such that the first pole and the second pole of the at least one battery cell associated with the coupling unit are connected to the first terminal and the second terminal, respectively, for the battery module associated with the coupling unit on the battery module line, and wherein the coupling unit is configured to disconnect the first input from the first output, disconnect the second input from the second output, and connect the first output to the second output of the battery module associated with the coupling unit in response to receiving the second control signal such that the first pole and the second pole of the at least one battery cell associated with the coupling unit are disconnected from the first terminal and the second terminal, respectively, for the battery module associated with the coupling unit on the battery module line and the first terminal and the second terminal are connected to each other, and wherein the control unit is connected to the sensor means and is configured (i) to select a battery module whose at least one battery cell has a lowest monitored state of charge of all the battery modules of the battery module line, and (ii) to output the second control signal to the coupling unit of the selected battery module.

* * * * *